(12) United States Patent
Evans et al.

(10) Patent No.: US 9,287,148 B1
(45) Date of Patent: Mar. 15, 2016

(54) DYNAMIC HEATING METHOD AND SYSTEM FOR WAFER PROCESSING

(71) Applicant: Varian Semiconductor Equipment Associates, Inc., Gloucester, MA (US)

(72) Inventors: Morgan D. Evans, Manchester, MA (US); Kevin Anglin, Somerville, MA (US); D. Jeffrey Lischer, Acton, MA (US); William T. Weaver, Austin, TX (US); Jason M. Schaller, Austin, TX (US); Robert Brent Vopat, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/575,591

(22) Filed: Dec. 18, 2014

(51) Int. Cl.
*H01L 33/00* (2010.01)
*H01L 21/67* (2006.01)
*H01L 21/324* (2006.01)
*H01L 21/265* (2006.01)
*H01J 37/317* (2006.01)

(52) U.S. Cl.
CPC ....... *H01L 21/67115* (2013.01); *H01J 37/3171* (2013.01); *H01L 21/265* (2013.01); *H01L 21/324* (2013.01)

(58) Field of Classification Search
USPC ......................................................... 257/98
See application file for complete search history.

(56) References Cited

U.S. PATENT DOCUMENTS

| 4,356,384 | A |   | 10/1982 | Gat |   |
|---|---|---|---|---|---|
| 5,262,870 | A | * | 11/1993 | Nakamura | H04N 1/1931 348/300 |
| 7,427,145 | B2 | * | 9/2008 | Jang | G02B 6/0031 257/100 |
| 2003/0160255 | A1 | * | 8/2003 | Taninaka | H01L 27/153 257/88 |
| 2012/0127376 | A1 | * | 5/2012 | Shikina | H01L 51/5284 348/800 |

OTHER PUBLICATIONS

Shen, Meihua, et al., Etch Planarization—A New Approach to Correct Non-Uniformity Post Chemical Mechanical Polishing, Advanced Semiconductor Manufacturing Conference, May 2014, pp. 423-427, IEEE.
Lee, Chris G N , et al., The Grand Challenges of Plasma Etching: A Manufacturing Perspective, Journal of Physics D: Applied Physics, 2014 vol. 47, pp. 1-9.

* cited by examiner

*Primary Examiner* — Thao P Le (57) ABSTRACT

A system and method for dynamic heating of a workpiece during processing is disclosed. The system includes an ion source and a plurality of LEDs arranged in an array, which are directed at a portion of the surface of the workpiece. The LEDs are selected so that they emit light in a frequency range that is readily absorbed by the workpiece, thus heating the workpiece. In some embodiments, the LEDs heat a portion of the workpiece just before that portion is processed by an ion beam. In another embodiment, the LEDs heat a portion of the workpiece as it is being processed. The LEDs may be arranged in an array, which may have a width that is at least as wide as the width of the ion beam. The array also has a length, perpendicular to its width, having one or more rows of LEDs.

15 Claims, 8 Drawing Sheets

DYNAMIC HEATING METHOD AND SYSTEM FOR WAFER PROCESSING

FIELD

Embodiments of the present disclosure relate to systems and methods for dynamically heating a workpiece during processing, and more particularly, using LED arrays to heat the workpiece during processing.

BACKGROUND

The fabrication of a semiconductor device involves a plurality of discrete and complex processes. To perform these processes, a workpiece is typically disposed on a platen. The platen may be an electrostatic chuck, designed to retain the workpiece through the application of electrostatic forces produced by electrodes within the platen.

In some embodiments, one or more of these processes may be non-uniform, in that portions of the workpiece are processed more than other portions. For example, a deposition process may deposit more material on a first portion of a workpiece than a second portion. In another example, a chemical mechanical planarization (CMP) process may remove less material from the first portion than from the second portion. To compensate for this, it may be advantageous to subsequently process the workpiece unevenly. For example, it may be beneficial to subsequently etch more material from the first portion than from the second portion. This technique may result in a more uniform workpiece than can otherwise be achieved.

Further, some semiconductor processes are sensitive to temperature, such that their efficiency varies based on the temperature of the workpiece during processing. For example, an identical etching process may remove more material from a heated workpiece than from a cooler workpiece.

This phenomenon may be exploited to achieve better uniformity during workpiece processing. However, to perform this temperature sensitive processing, precise heating of small portions of the workpiece may be desired. However, techniques to selectively heat a workpiece may be imprecise or may not permit the desired resolution.

Therefore, it would be beneficial if there were a system and method for dynamically heating portions of the workpiece during workpiece processing that allowed the desired amount of temperature and spatial control.

SUMMARY

A system and method for dynamic heating of a workpiece during processing is disclosed. The system includes an ion source and a plurality of LEDs arranged in an array, which are directed at a portion of the surface of the workpiece. The LEDs are selected so that they emit light in a frequency range that is readily absorbed by the workpiece, thus heating the workpiece. In some embodiments, the LEDs heat a portion of the workpiece just before that portion is processed by an ion beam. In another embodiment, the LEDs heat a portion of the workpiece as it is being processed. The LEDs may be arranged in an array, which may have a width that is at least as wide as the width of the ion beam. The array also has a length, perpendicular to its width, having one or more rows of LEDs.

In one embodiment, a workpiece processing system is disclosed. The workpiece processing system comprises an ion source having an extraction aperture having a width, wherein the extraction aperture is located on a side of the ion source; a first LED array disposed proximate a workpiece on one side of the extraction aperture, the first LED array having a second width and being parallel to the extraction aperture; and a second LED array disposed proximate the workpiece, the second LED array parallel to the extraction aperture on an opposite side of the extraction aperture from the first LED array, the second LED array having the second width, wherein the first LED array and the second LED array each comprise a plurality of LEDs arranged in a plurality of columns and at least one row. In certain embodiments, the LEDs emit light having a wavelength of less than 1 µm. In certain embodiments, a controller is in communication with the first LED array and the second LED array to selectively actuate the plurality of LEDs. In some embodiments, each of the plurality of LEDs is independently actuated. In some embodiments, the first LED array and the second LED array are disposed on the side of the ion source proximate the extraction aperture. In other embodiments, the first LED array and the second LED array are disposed on extraction electrodes disposed closest to the workpiece.

In another embodiment, a workpiece processing system is disclosed. The workpiece processing system comprises an ion source producing an ion beam having a width, wherein an ion beam is focused at a region of a workpiece; an LED array comprising a plurality of LEDs arranged in a plurality of columns and at least one row; and an optical device to direct light emitted from the plurality of LEDs toward the region of the workpiece. In some embodiments, the ion source is a beam line ion implanter. In other embodiments, the ion source is a plasma chamber.

In another embodiment, a method of processing a workpiece is disclosed. The method comprises selectively heating a first location on the workpiece with light emitted from a first LED in an LED array; scanning the workpiece in a scanning direction; and exposing the first location to an ion beam after the heating. In a further embodiment, the method also comprises selectively heating the first location with light emitted from a second LED on the LED array. In another further embodiment, the method also comprises selectively heating a second location on the workpiece with light emitted from the first LED while the first location is selectively heated by light emitted from the second LED.

BRIEF DESCRIPTION OF THE FIGURES

For a better understanding of the present disclosure, reference is made to the accompanying drawings, which are incorporated herein by reference and in which.

DETAILED DESCRIPTION

As described above, it may be beneficial to selective and dynamically heat portions of a workpiece during processing to exploit the temperature sensitivity of a particular semiconductor fabrication process.

Figure 1A:
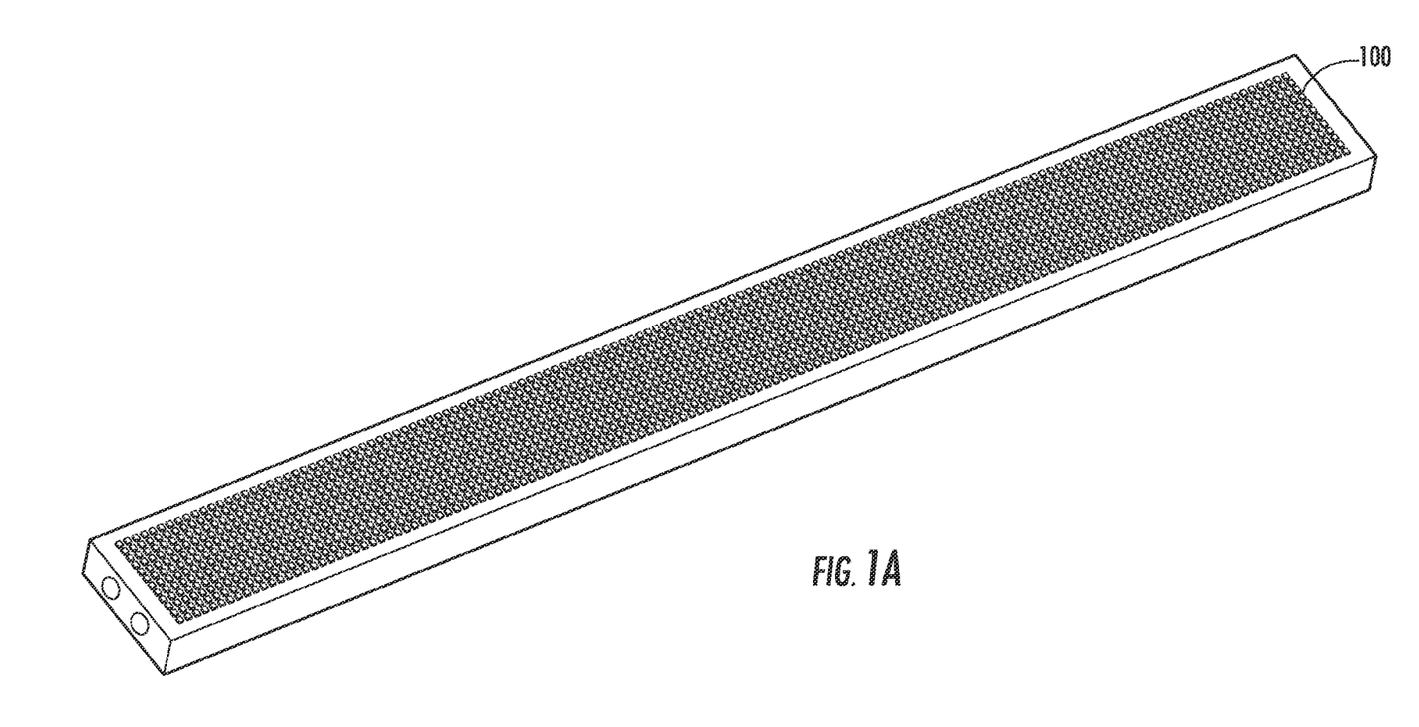
FIG. 1A is a perspective view of a LED array according to one embodiment.

FIG. 1A shows a perspective view of a first embodiment of a LED array 100 used to dynamically heat selected portions of a workpiece. The LED array 100 may have a width that is greater than its length. The width of the LED array 100 may be selected to be at least as wide as the ion beam, as will be explained in more detail below. In some embodiments, the width of the LED array 100 is wider than the ion beam. The LED array 100 also has a length, which is the dimension perpendicular to the width. The length of the LED array 100 may be any size and is not limited by the disclosure.

Figures 1B, 1C:
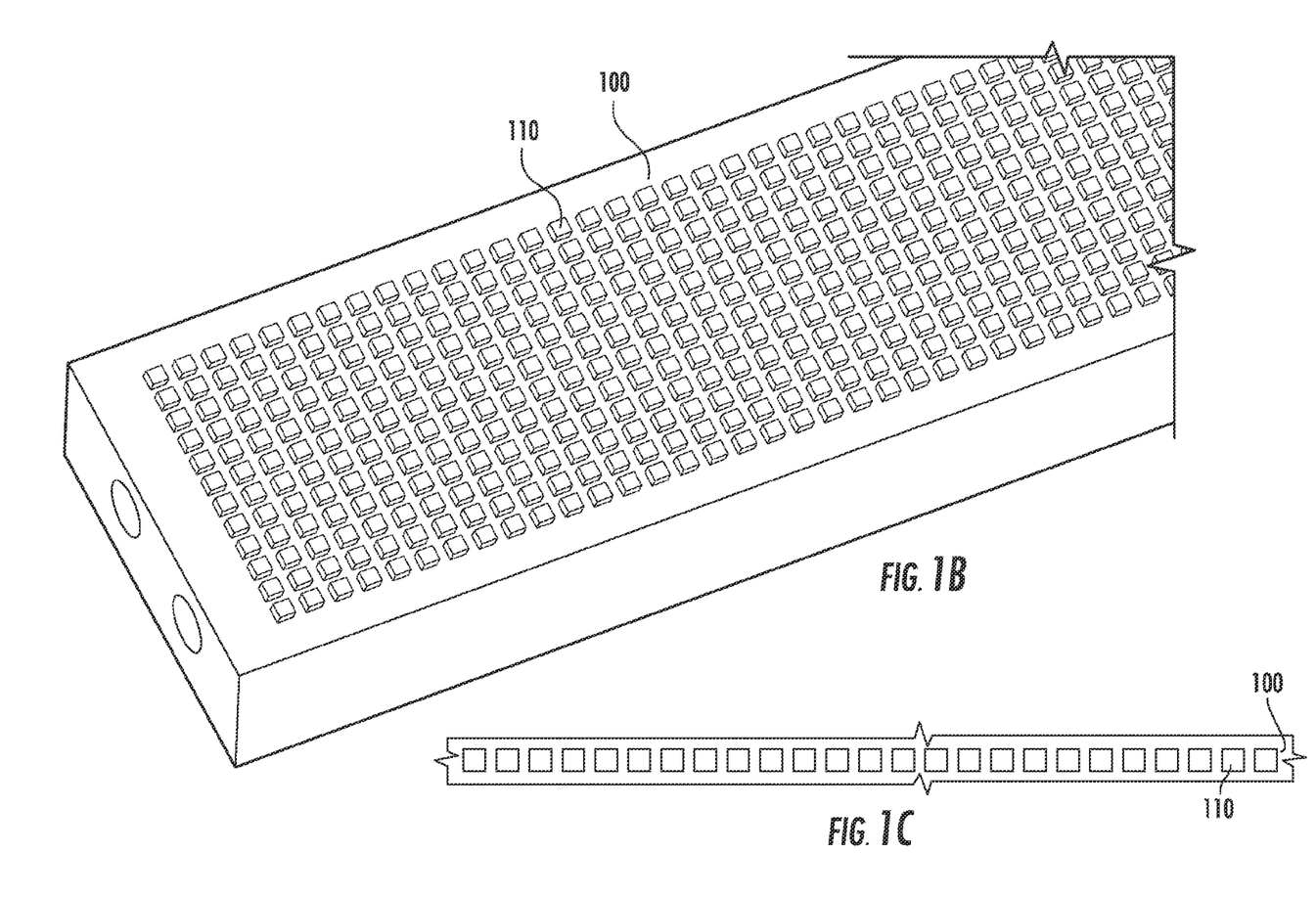
FIG. 1B is an enlarged view of one embodiment of the LED array of FIG. 1A.
FIG. 1C is a top view of a second embodiment of the LED array of FIG. 1A.

FIG. 1B shows an enlarged view of one embodiment of the LED array of FIG. 1A. The LED array 100 is comprised of a plurality of individual light emitting diodes (LEDs) 110, arranged in a two dimensional array. In this embodiment, there are twelve LEDs 110 disposed in the length direction of the LED array 100, which may be referred to as rows of LEDs. However, any number of rows of LEDs may be used. For example, FIG. 1C shows a top view of a second embodiment of the LED array of FIG. 1A. In this embodiment, there is only one row of LEDs 110. In all embodiments, a plurality of LEDs 110 is disposed along the width direction. The set of LEDs aligned in the length direction may be referred to as columns of LEDs. Any number of columns of LEDs may be used. Thus, the LED array 100 comprises a plurality of LEDs 110 arranged in a plurality of columns and at least one row. In most embodiments, the LED array 100 also comprises a plurality of rows, such as between 5 and 50 rows, although the number of rows is not limited by the disclosure.

In these embodiments, each of the LEDs 110 may be independently controllable, so that any LED 110 may be actuated independent of all other LEDs 110. In other words, an LED 110 disposed in a particular row and column may be actuated without actuating any other LEDs 110 in that row or column.

In certain embodiments, the particular type of LED is selected so that its output frequency is readily absorbed by the workpiece being processed or a film deposited on the workpiece. For example, silicon absorbs light energy having a wavelength of about 1 μm or less. The absorption of silicon decreases significantly above this wavelength. Thus, in one embodiment, the LEDs 110 are each made from InGaN, which emits light at a wavelength of about 450-490 nm. In another embodiment, the LEDs 110 are each made from AlGaAs or GaAsP, which emits light at a wavelength of about 610-760 nm. Both of these types of LEDs emit light that is absorbed by a silicon workpiece, and converted to heat. Of course, other types of LEDs that emit light having a wavelength of 1 μm or less may be utilized.

In some embodiments, the wavelength of the LEDs 110 is selected based on the absorption characteristics of a film deposited on the workpiece. The film may be, for example, an oxide or a nitride. The film may have the same or different absorption characteristics than the underlying workpiece.

In other embodiments, different types of workpieces may be used. For example, other workpieces may be made using GaN, AlN, GaAs, Ge, sapphire, or other materials. In these embodiments, the wavelength of the LEDs 110 may be selected such that the wavelength of the LEDs 110 is absorbed by that particular workpiece. In some embodiments, LEDs that emit ultraviolet light may be used.

In some embodiments, the LED array 100 may comprise plurality of LEDs 110, having different output wavelengths. For example, some of the LEDs 110 may be optimized for silicon, while others of the LEDs 110 may be optimized for a different material, such as a film deposited on the workpiece or a different type of workpiece.

The LED array 100 also comprises a circuit board (not shown) in communication with each of the LEDs 110. The circuit board may provide individual control for each LED 110. Additionally, the circuit board may provide a heat sink for the LEDs 110. The circuit board may be in communication with a controller.

Each of the LEDs 110 may occupy an area of 1 $mm^2$ or less. In some embodiments, the LEDS 110 may each occupy an area of 100 μm×100 μm. Thus, in an area of 1 $cm^2$, it may be possible to dispose one hundred or more LEDs 110, in any configuration. Further, each LED may generate about 1 W/$mm^2$ of power.

The light emitted from the LEDs 110 is sufficient to raise the temperature of the portion of the workpiece that receives the light. In one test, a 15° C. rise in temperature was observed when the workpiece was exposed to light from the LEDs 110 for a period of 5 seconds, at a scanning speed of 10 mm/sec. Furthermore, in another test, individual control of the LEDs 110 allows a temperature gradient on the workpiece of greater than 10° C./cm, at a scanning speed of 10 mm/s. In other words, by heating one portion and not heating or even cooling an adjacent portion, a temperature gradient may be created. This precise control of temperature is achieved due to the small size of each LED 110, the power generated by each LED 110 and the individual control of each LED 110. Similar temperature gradients cannot be generated using lamps, as the light power cannot be as finely focused as is possible with the present LED array 100.

Figure 2A:
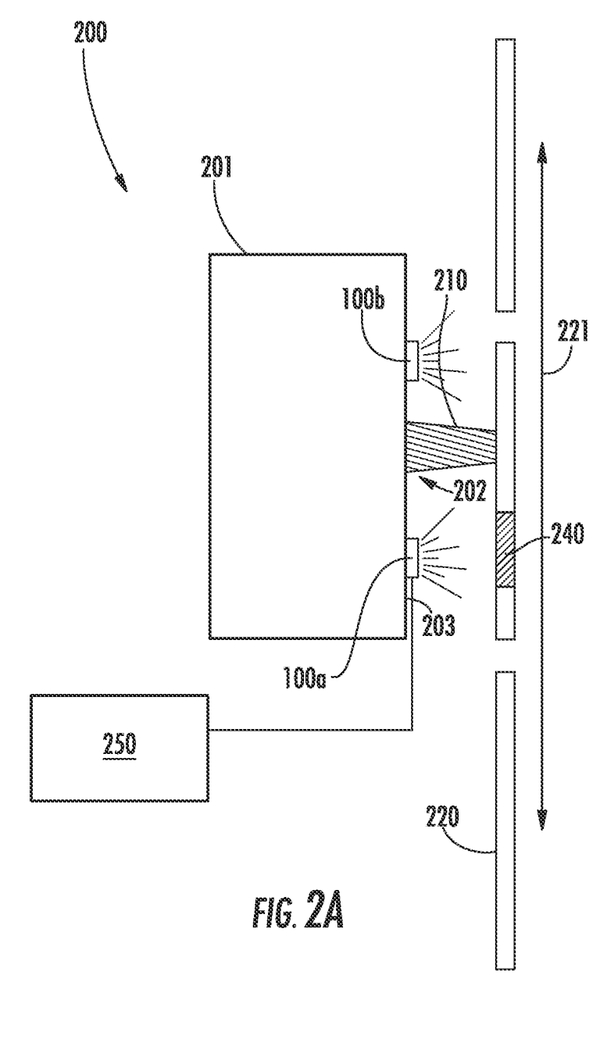
FIG. 2A illustrates a first system utilizing the LED array.

FIG. 2A shows a first embodiment of a system 200 using the LED array 100. In this embodiment, an ion source 201 is used to create ions. In one embodiment, the ion source 201 may be a plasma chamber, having a gas inlet and an RF antenna disposed on an external wall to energize the gas in the plasma chamber to create ions. Those ions are extracted from the ion source 201 through an extraction aperture 202 as an ion beam 210. The extraction aperture 202 may be located on the side 203 of the ion source 201 that is closest to the workpiece 220. The ion beam 210 is directed toward the workpiece 220. The workpiece 220 is scanned in a scanning direction 221. In this illustrated embodiment, the ion beam 210 is a ribbon beam with its width, which is the longer dimension, going into the page. A first LED array 100a is disposed on the side 203 of the ion source 201, on the surface that is closest to the workpiece 220, proximate the extraction aperture 202. Like the ion beam 210, the width of the first LED array 100a extends into the page. A second LED array 100b is also disposed on the side 203 of the ion source 201 proximate the extraction aperture 202. This second LED array 100b is disposed on the surface of side 203 closest to the workpiece, and is on the opposite side of the extraction aperture 202 from the first LED array 100a.

A controller 250 may be in communication with the first LED array 100a and the second LED array 100b. The controller 250 may comprise a processing unit and a memory element in communication with the processing unit. The memory element may be used to store instructions, which when executed by the processing unit, allow the system 200 to operate as described herein. The memory element may also contain other data. The controller 250 may also have other inputs. For example, a heat map may be provided to the controller 250. This heat map may be a two dimensional array, where each entry in the array represents a physical location on the workpiece 220. The value stored in each entry may be representative of the heat setting that is to be applied to that physical location. The controller 250 may also have other inputs. For example, the controller 250 may be aware of the scanning speed and the scanning direction of the workpiece 220 so as to properly control the LED arrays 100. Additionally, the controller 250 is aware of the configuration of the LED arrays 100, such as the number of rows and columns. The controller 250 may also be aware of the physical configuration, including the distances between the LED arrays 100 and the ion beam 210 and other dimensions. The controller 250 is used to selectively actuate the plurality of LEDs 110 disposed in the first LED array 100a and the second LED array 100b.

In this embodiment, the workpiece 220 may be scanned in the scanning direction 221. When the workpiece 220 is moving upward, the controller 250 may use the first LED array 100a to preheat the workpiece 220. As can be seen, the light energy from first LED array 100a will strike a particular location 240 on the workpiece before the ion beam 210 strikes that location 240 or concurrent with the ion beam 210. When the workpiece is being scanned in this direction, the second LED array 100b may be disabled by the controller 250. When the workpiece 220 is scanned downward in the scanning direction 221, the second LED array 100b is enabled by the controller 250 and is used to heat a location on the workpiece prior to, or concurrent with, its exposure to the ion beam 210. In the downward direction, the first LED array 100a may be disabled by the controller 250. In one embodiment, the first LED array 100a and the second LED array 100b may be disposed about 5 mm above the workpiece 220. Of course, other distances may also be used.

As described above, the extraction aperture 202 has a width which is much greater than its length. The workpiece 220 is scanned in the scanning direction 221, which is parallel to the length dimension of the extraction aperture 202 and perpendicular to its width. The first LED array 100a is disposed on one side of the extraction aperture 202 along the length direction and the second LED array 100b is disposed on the opposite side of the extraction aperture 202 in the length direction. In this way, the first LED array 100a and the second LED array 100b are disposed in a parallel configuration with the extraction aperture 202 in the length direction. As described above, the width of the first LED array 100a and the second LED array 100b may exceed the width of the extraction aperture 202.

In an alternate embodiment, the workpiece 220 is only scanned in one direction or is only processed in one direction of a reciprocating system. In this embodiment, only one LED array 100 may be employed.

Further, FIG. 2A shows the first LED array 100a and the second LED array 100b disposed directly on the bottom surface of side 203 of the ion source 201. In another embodiment, the first LED array 100a and the second LED array 100b are disposed near the workpiece 220 on either side of the extraction aperture 202, however they are not disposed directly on the side 203. In one embodiment, the first LED array 100a and the second LED array 100b may be disposed on platforms disposed on the side 203, extending toward the workpiece 220. In another embodiment, the first LED array 100a and the second LED array 100b may not be connected to the side 203 at all.

Figure 2B:
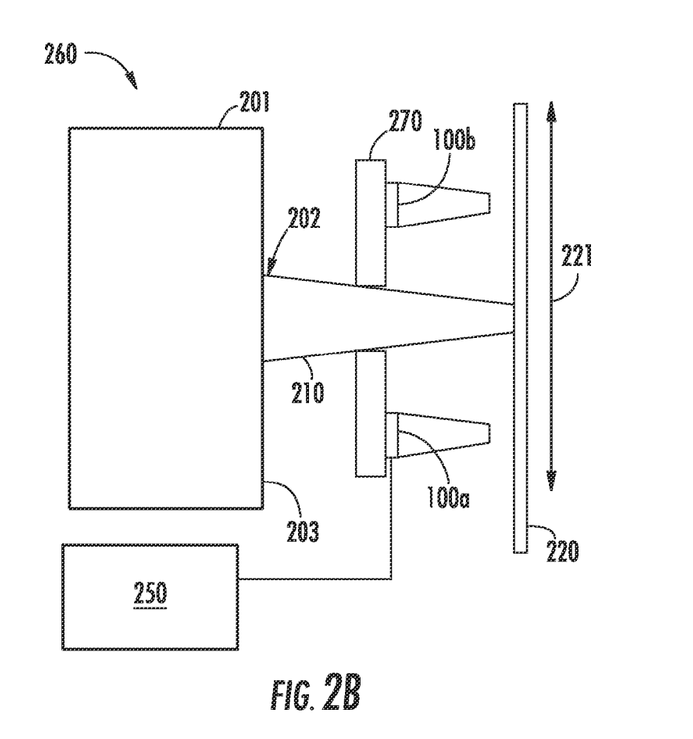
FIG. 2B illustrates a variation of the first system shown in FIG. 2A.

FIG. 2B shows a variation of the system of FIG. 2A. In this configuration, the system 260 includes extraction electrodes 270 that are used to attract and accelerate the ion beam 210 from the ion source 201 toward the workpiece 220. As before, an extraction aperture 202 is disposed on side 203 of the ion source 201. The first LED array 100a and the second LED array 100b are disposed on the extraction electrode 270, on the surface closest to the workpiece 220. While FIG. 2B shows only one set of extraction electrodes 270, it is understood that any number of extraction electrodes may be included and that the LED arrays 100 are disposed on those electrodes closest to the workpiece 220.

Figure 2C:
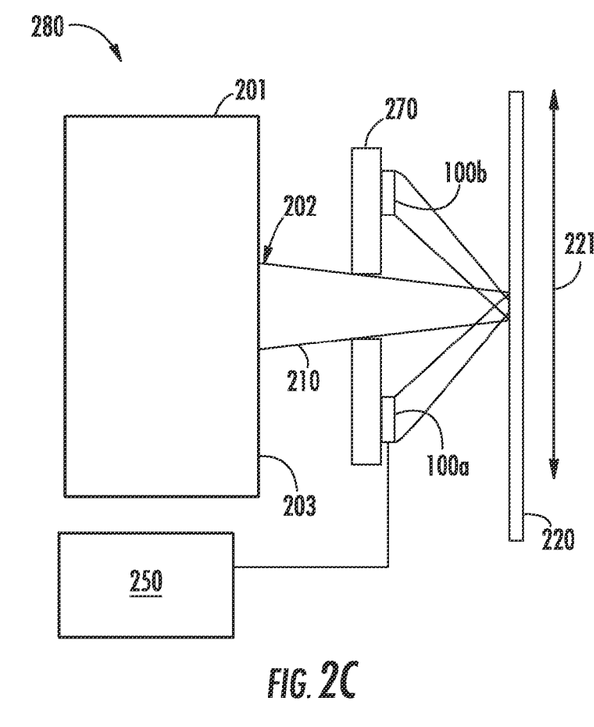
FIG. 2C illustrates a variation of the system shown in FIG. 2B.

FIG. 2C shows a variation of the system of FIG. 2B. This system 280 is similar to that shown in FIG. 2B in that the LED arrays 100 are disposed on the extraction electrodes 270. However, in this embodiment, the LED arrays 100 are focused inward toward the ion beam 210. In some embodiments, the light from the LED arrays 100 is focused at a location near the ion beam 210 so that the workpiece 220 is heated prior to exposure by the ion beam 210. In another embodiment, light from the LED arrays 100 is focused at the same portion of the workpiece 220 that is being exposed to the ion beam 210 so that that portion is concurrently heated and exposed to the ion beam 210.

Thus, in each of the embodiments shown in FIG. 2A-C, the LED arrays 100 are disposed on the component that is disposed closest to the workpiece 220. In some embodiments, this closest component may be the bottom surface of side 203 of the ion source 201. In other embodiments, this closest component may be an extraction electrode 270. Further, in any of these embodiments, the light from the LED arrays 100 may be directed so as to be parallel with the ion beam 210, as shown in FIGS. 2A-2B. In other embodiments, the light from the LED arrays 100 may be angled and may be focused toward the ion beam 210. In this way, the light is directed toward the portion of the workpiece 220 that is exposed to the ion beam 210 or a portion that will soon be exposed to the ion beam 210, as shown in FIG. 2C.

Figure 3:
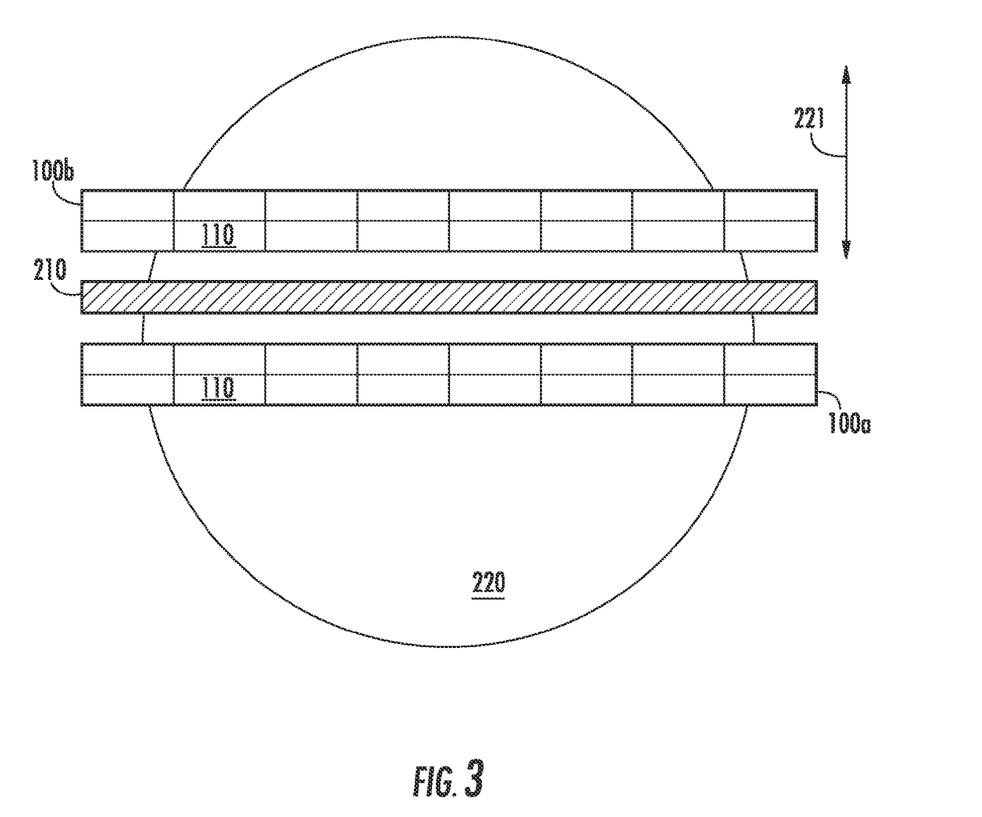
FIG. 3 is a top view of the system of FIG. 2A.

FIG. 3 shows a top view of the workpiece 220 as it is being processed by system 200 of FIG. 2A. In this figure, the workpiece 220, the ion beam 210, the first LED array 100a and the second LED array 100b are shown from a top view. As described above the first LED array 100a, the second LED array 100b and the ion beam 210 are parallel in the length direction. As in FIG. 2A, the workpiece 220 is scanned upward in scanning direction 221. In this embodiment, the first LED array 100a and the second LED array 100b each have 8 LEDs 110 in the width direction (i.e. 8 columns) and 2 rows of LEDs 110 in the length direction. However, this is simply for illustrative purposes, as the first LED array 100a and the second LED array 100b may have any number of LEDs 110 in each direction. In some embodiments, the first LED array 100a and the second LED array 100b have an equal number of rows and an equal number of columns.

As the workpiece 220 is scanned upward, a particular location on the workpiece 220 is first exposed to an LED in a certain column in the lower row of LEDs 110 in the first LED array 100a. That location on the workpiece 220 is then exposed to an LED in the same column in the upper row of LEDs 110 in the first LED array 100a. After that, that location is exposed to the ion beam 210.

Figure 4A:
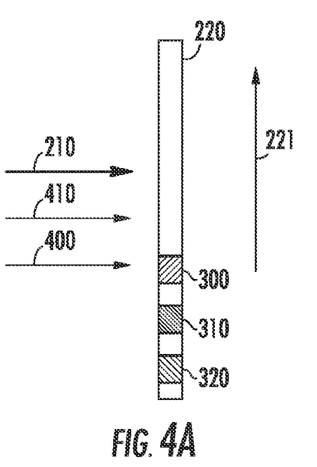
FIGS. 4A-E show a sequence of heating and exposing the workpiece.
Figure 4B:
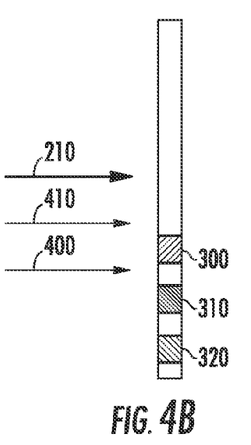
Figure 4C:
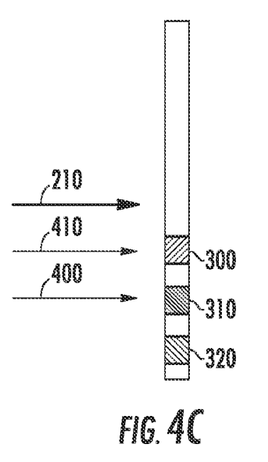
Figure 4D:
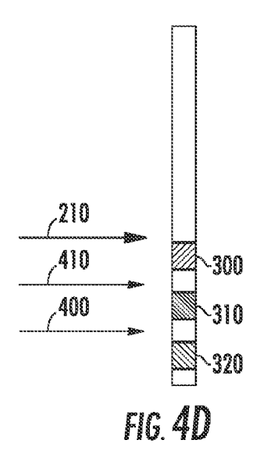
Figure 4E:
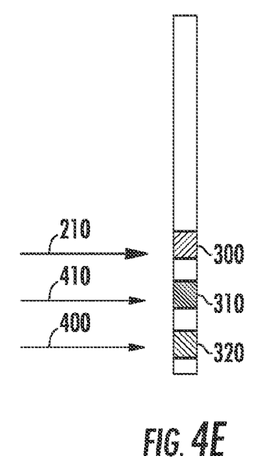

FIG. 4A-E shows a sequence of figures illustrating the heating and exposing of a particular location 300 on a workpiece 220. In these figures, the LEDs 400, 410 are part of the first LED array 100a, wherein LED 400 is in the lower row and LED 410 is in the same column as LED 400, but in the upper row. These LEDs 400, 410 and the ion beam 210 are assumed to be spatially fixed, while the workpiece 220 is moved in the upward direction. While FIGS. 3 and 4A-E illustrate LED arrays 100 having two rows, it is understood that any number of rows may be used in the LED arrays 100. Each figure in the sequence represents a subsequent point in time. In FIG. 4A, location 300 is exposed to an LED 400 in the lower row of the first LED array 100a. This LED 400 may be actuated or may be turned off. If the LED 400 in the lower row is actuated, the location 300 will be heated. As the workpiece 220 is scanned upward, as shown in FIG. 4B, location 300 begins moving past the LED 400 and towards the LED 410 in the upper row of the first LED array 100a. In FIG. 4C, the location 300 is now exposed to the LED 410 in the upper row of the first LED array 100a. Again, this LED 410 may be actuated or may be turned off. As the workpiece 220 continues to move in the scanning direction, the location 300 begins to move past the LED 410 and toward the ion beam 210, as shown in FIG. 4D. In FIG. 4E, the location 300 is now exposed to the ion beam 210.

In this illustration, there are two rows of LEDs 400, 410. This allows the location 300 to be heated to a plurality of different temperatures. For example, in one embodiment, the location 300 is not to be heated at all. In this embodiment, the LED 400 and the LED 410 may both be turned off when location 300 is disposed in their respective paths. In another embodiment, the location 300 may be heated only slightly. In this embodiment, the LED 400 may be actuated in FIG. 4A and the LED 410 may be turned off in FIG. 4C. This combination applies some heat to location 300, however, the location 300 begins to cool before reaching the ion beam 210. In a third embodiment, the location 300 may be heated more than the previous embodiment. In this case, the LED 400 may be turned off in FIG. 4A and the LED 410 may be actuated in FIG. 4C. Although the same amount of heat is being applied to the location 300, the location 300 may be warmer in this embodiment when it reaches the ion beam 210, since the heating occurs more recently. In a fourth embodiment, the location 300 is heated by both the LED 400 in FIG. 4A and the LED 410 in FIG. 4C. This heats location 300 more than the other embodiments.

The use of two rows of LEDs allows for four different heat settings for location 300, as shown in Table 1 below.

TABLE 1

| Heat Setting | LED 400 | LED 410 |
|---|---|---|
| 1 (lowest) | Off | Off |
| 2 (low) | ON | Off |
| 3 (medium) | Off | ON |
| 4 (highest) | ON | ON |

The table above assumed that the LEDs are either actuated or turned off. However, the number of heat settings may be increased by modulating the LEDs. For example, the LEDS may be made to blink. The duty cycle of that blinking action may determine the amount of heat delivered to the workpiece. For example, a LED that is turned off may be assumed to have a 0% duty cycle, while a LED that is actuated may be assumed to have a 100% duty cycle. Any duty cycle between these two values may be used to deliver a different amount of heat. The frequency of this blinking may be any suitable frequency and is not limited by this disclosure.

Of course, a different number of rows allows for more or less heat settings. For example, if only one row of LEDs 110 is used in the LED array, only two heat settings may be achieved, unless modulation of the LEDs 110 is employed. If three rows of LEDs 110 are used, eight different heat settings may be possible. More heat settings are possible if modulation of the LEDs 110 is employed.

The controller 250 may use the distance between the rows of the LED array, the scanning direction 221 and the scanning speed to determine when a particular location 300 is disposed in front of one of the LEDs 400, 410 in the first LED array 100a. The scanning speed may also be used to determine the duration that each LED 400, 410 is actuated. For example, if the scanning speed is a first speed, which may be relatively slow, the LEDs 400, 410 may be actuated for a first time period. If the scanning speed is a second speed, greater than the first speed, the LEDs 400, 410 may be actuated for a second time period, shorter than the first time period. This is because location 300 passes each of the LEDs 400, 410 more quickly when the scanning speed is increased. In addition, the time between when location 300 is disposed in front of LED 400 and when location 300 is disposed in front of LED 410 is shortened with increased scanning speed.

FIGS. 4A-4E describe an embodiment where each LED 400, 410 is individually controllable. In other embodiments, two or more LEDS in a single column may be addressed and controlled by the controller 250 as a group.

As described above, the heating and exposing process operates on multiple locations of the workpiece simultaneously. Thus, as shown in FIG. 4C, when the location 300 has reached the LED 410, a second location 310 is now exposed to the LED 400. In FIG. 4E, when location 300 is exposed to the ion beam 210, the second location 310 is exposed to the LED 410. Additionally, a third location 320 is disposed in front of LED 400 in FIG. 4E. Note that the location being processed by each element is dependent on the distance between the elements, and those distances may differ from those shown in FIGS. 4A-E.

Thus, at any given time, each LED 400, 410 and the ion beam 210 are each operating on a different location. For example, LED 400 may operate on location i. At a later time, LED 410 may operate on location i, while LED 400 is now operating on location i+1. At an even later time, location i may be exposed to the ion beam 210, while LED 410 is operating on location i+1 and LED 400 is operating on location i+2. The controller 250 controls each LED 400, 410 based on the heat map and the physical location that is disposed in front of each respective LED. If the LED array 100 has more than two rows of LEDs, more physical locations may be simultaneously operated upon by the LED array 100.

As described above, each LED operates on a particular location that is exposed to the light from that LED. The size of each location may be determined based on the size of each LED, the scanning speed, and the turn on/turn off times of the LEDs. At lower scanning speeds, the size of each location may be smaller.

After the LEDs 400, 410 heat the workpiece 220, the workpiece 220 begins cooling before it reaches the ion beam 210. In other words, no heat is provided to the workpiece 220 in the space between the final row of LEDs and the ion beam 210. Therefore, in some embodiments, it may be beneficial to position the LEDs as close to the ion beam 210 as possible to maximize the heating effects of the LEDs. Thus, in FIG. 2A, the first LED array 100a and the second LED array 100b are shown disposed close to the extraction aperture 202. In some embodiments, the first LED array 100a and the second LED array 100b may be disposed about 1 cm away from the extraction aperture 202. The distance between the location that is being heated by the LED arrays and the ion beam may be further decreased by angling the light from the LED arrays toward the ion beam 210, as shown in FIG. 2C.

However, in other embodiments, the LED arrays 100 may be disposed further from the workpiece 220. In these embodiments, optical devices may be used to focus the light from the LEDs 110 toward the workpiece 220. As explained above, heat is maximized when the region targeted by the LEDs 110 is disposed immediately before, or concurrent with, the ion beam 210.

In some embodiments, the light from the LED arrays 100 may be focused so as to strike the location on the workpiece 220 that is being exposed to the ion beam 210. Thus, in this embodiment, the heating and the exposing occur simultaneously. In other words, the ion beam and the light from the LED array 100 are confocal.

Figure 5:
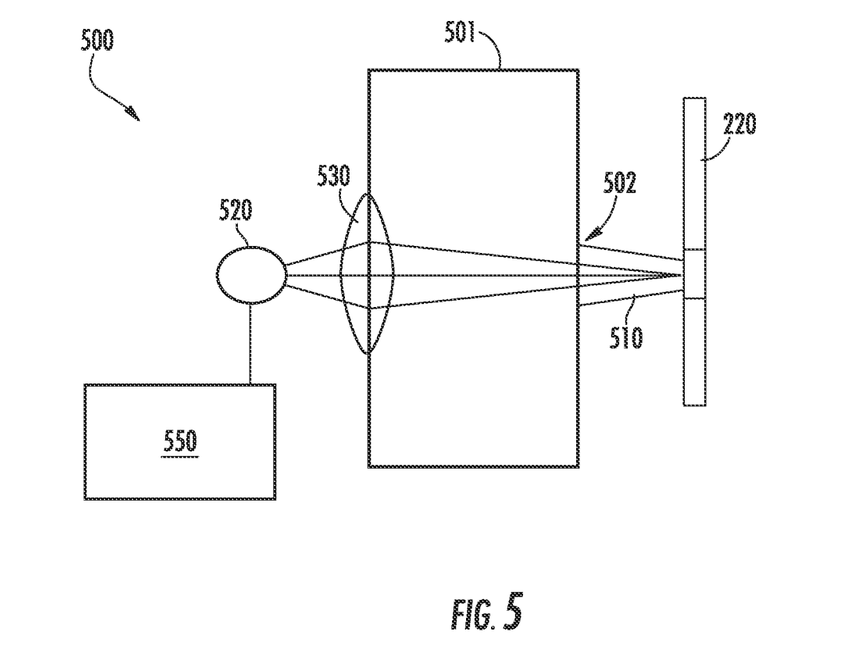
FIG. 5 illustrates a second system utilizing the LED array.

FIG. 5 shows a second embodiment of a system 500 that utilizes a LED array. In this embodiment, an ion source 501 is used to produce an ion beam 510 that is directed toward the workpiece 220. In one embodiment, the ion source 501 may be a plasma chamber, having a gas inlet and an RF antenna disposed on an external wall to energize the gas in the plasma chamber to create ions. In this embodiment, the LED array 520 is disposed distal from the ion beam 510 and the extraction aperture 502. As above, the LED array 520 is in communication with a controller 550, such as that described in connection with FIG. 2A. The LED array 520 comprises a plurality of LEDs, arranged in a plurality of columns and at least one row. In this embodiment, an optical device 530, such as a window and/or a lens, is disposed on the side of the ion source 501 opposite the extraction aperture 502. The LED array 520 is disposed proximate the optical device 530, so that the light emitted by the LEDs in the LED array 520 is focused and transmitted through the interior of the ion source 501 and exits through the extraction aperture 502 with the ion beam 510.

Thus, in the system 500, the heating of the workpiece 220 and the exposure to the ion beam 510 are simultaneous. In some embodiments, the ion beam 510 may have a certain width. The LED array may be constructed with a sufficient number of rows so as to heat the entirety of this width.

Figure 6:
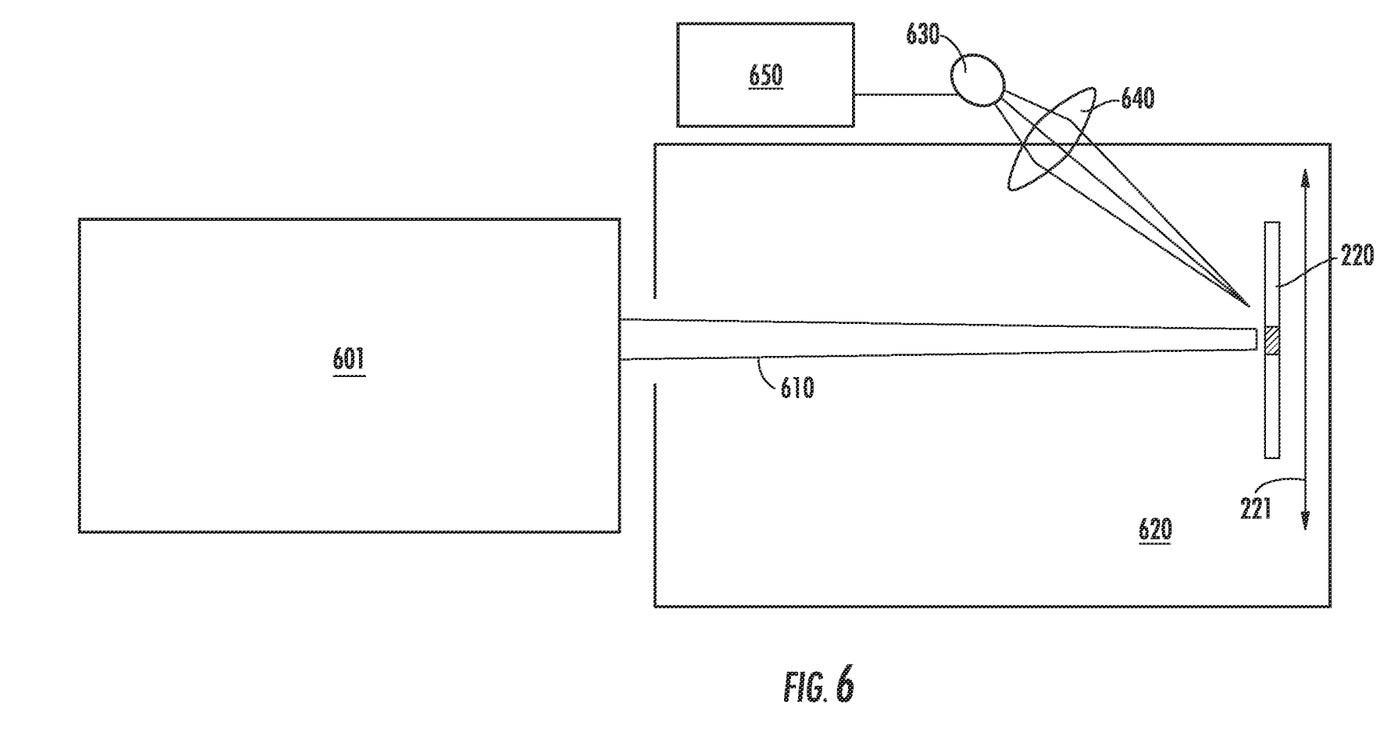
FIG. 6 illustrates a third system utilizing the LED array.

FIG. 6 shows another system 600 that utilizes the LED array 630. In this embodiment, the ion source 601 may be a beam-line ion implanter. The ion source 601 may comprise an ion generator, such as an IHC source, and associated optics to direct the ions extracted from the ion generator. Of course, other ion generators, such as Bernas sources, may also be used. Additionally, the ion source 601 may comprise one or more magnets, such as a mass analyzing magnet. The ion source 601 may also include acceleration and deceleration stages to regulate the ion beam 610.

The ion source 601 generates an ion beam 610 that enters the process chamber 620 and is directed toward the workpiece 220. The LED array 630 may be disposed distal from the workpiece 220, as shown in FIG. 6. As before, the LED array 630 may be in communication with a controller 650. In this embodiment, optical devices 640, such as focusing lenses, may be used to direct light from the LED array 630 toward the workpiece 220.

In one embodiment, the light from the LED array 630 is directed so that it is directed to the same portion of the workpiece 220 that is being exposed to the ion beam 610, so as to be confocal. In this embodiment, the optical devices 640 may be stationary, as the target of the light is unchanging.

In another embodiment, the light from the LED array 630 is focused at a portion of the workpiece 220 that will soon be exposed to the ion beam 610. In other words, the light may be focused at locations on the workpiece 220 disposed above the region exposed to the ion beam 610 when the workpiece 220 is moving downward in scanning direction 221. The light may be focused at locations on the workpiece 220 disposed below the region exposed to the ion beam 610 when the workpiece is moving upward. This may be performed in one of several ways. In one embodiment, two different LED arrays 630 are arranged in the process chamber 620, where one LED array is focused at a location on the workpiece 220 disposed above the portion being exposed to the ion beam 610, and the second LED array is focused at a location on the workpiece 220 disposed below the portion being exposed to the ion beam 610. In this embodiment, the optical devices 640 may be stationary as the target of each LED array is unchanged. In another embodiment, the optical device 640 is movable, such that the light from the LED array 630 is focused at one of two different locations, based on the scanning direction 221.

FIG. 6 shows the light being focused through an optical device 640, such as a lens. However, other embodiments are also possible. For example, in another embodiment, the optical device 640 may be a focusing mirror. In this embodiment, the light from the LED array 630 may be reflected and focused by the focusing mirror. As described above, the light may be focused at the location being exposed to the ion beam 610, or may be focused at a location that will soon be exposed to the ion beam 610.

Furthermore, the LED arrays described in the various embodiments may be utilized in a plurality of different environments.

In one embodiment, as described above, the LED array is used to preheat a portion of the workpiece prior to or concurrent with its exposure to the ion beam. This may be used to exploit a temperature sensitivity of the process being performed by the ion beam.

In another embodiment, the LED array is used to pre-heat the workpiece to match the beam power being used. In this manner, all processing of the wafer occurs at a single temperature, that is, without a "warm-up" period.

In another embodiment, the LED array is used to allow thermally uniform wafer processing to compensate for uneven beam heating. For example, in some instances, the extremes of the workpiece (such as the upper edge and lower edge during a scan) may have similar thermal profiles, which may differ from the center of the workpiece by more than 10° C. in some heat power applications. This may be because the middle of the workpiece is exposed to the ion beam more often that the edges of the workpiece. The use of an LED array allows more preheating of these edges so that they are roughly the same temperature as the center of the workpiece.

In another embodiment, the temperature of the workpiece along its outer circumference may be less than the rest of the workpiece due to the fact that the platen is slightly smaller than the workpiece. Because of this, the outer circumference of the workpiece is not heated by the platen. The use of an LED array may allow more preheating of this outer circumference so that its temperature is closer to that of the rest of the workpiece. Alternatively, in some embodiments, the platen is used to cool the workpiece. In this scenario, the outer circumference may be warmer than the rest of the workpiece. The use of an LED array may allow more preheating of the rest of the workpiece so that its temperature is closer to that of the outer circumference.

While the LED array can be used to selectively heat the workpiece, it is noted that this apparatus may be used in conjunction with other heating techniques. For example, the LED array may be used in conjunction with a heated platen.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece processing system, comprising:
an ion source having an extraction aperture having a width, wherein the extraction aperture is located on a side of the ion source;
a first LED array disposed proximate a workpiece on one side of the extraction aperture, the first LED array having a second width and being parallel to the extraction aperture; and
a second LED array disposed proximate the workpiece, the second LED array parallel to the extraction aperture on an opposite side of the extraction aperture from the first LED array, the second LED array having the second width,
wherein the first LED array and the second LED array each comprise a plurality of LEDs arranged in a plurality of columns and at least one row.

2. The workpiece processing system of claim 1, wherein the LEDs emit light having a wavelength less than 1 μm.

3. The workpiece processing system of claim 1, wherein the second width is greater than the width of the extraction aperture.

4. The workpiece processing system of claim 1, further comprising a controller in communication with the first LED array and the second LED array to selectively actuate the plurality of LEDs.

5. The workpiece processing system of claim 4, wherein each of the plurality of LEDS is independently actuated.

6. The workpiece processing system of claim 4, wherein the controller comprises a memory element having a heat map, wherein the controller uses the heat map to selectively actuate the plurality of LEDs.

7. The workpiece processing system of claim 1, wherein the first LED array and the second LED array are disposed on the side of the ion source proximate the extraction aperture.

8. The workpiece processing system of claim 1, further comprising one or more extraction electrodes disposed between the ion source and the workpiece, where the first LED array and the second LED array are disposed on the extraction electrodes disposed closest to the workpiece.

9. The workpiece processing system of claim 1, wherein light from the first LED array and the second LED array is approximately parallel to an ion beam extracted from the extraction aperture.

10. The workpiece processing system of claim 1, wherein light from the first LED array and the second LED array is focused toward an ion beam extracted from the extraction aperture.

11. A workpiece processing system, comprising:
an ion source producing an ion beam having a width, wherein an ion beam is focused at a region of a workpiece;
an LED array comprising a plurality of LEDs arranged in a plurality of columns and at least one row; and
an optical device to direct light emitted from the plurality of LEDs toward the region of the workpiece.

12. The workpiece processing system of claim 11, wherein the ion source comprises a beam line ion implanter.

13. The workpiece processing system of claim 12, wherein the optical device comprises a lens or a focusing mirror.

14. The workpiece processing system of claim 11, wherein the ion source comprises a plasma chamber.

15. The workpiece processing system of claim 14, wherein the optical device is disposed on a wall of the plasma chamber and the light emitted from the plurality of LEDs passes through the plasma chamber.

* * * * *